United States Patent
Bagheri et al.

(10) Patent No.: US 7,271,668 B2
(45) Date of Patent: Sep. 18, 2007

(54) MIXER CIRCUITS AND METHODS WITH IMPROVED SPECTRAL PURITY

(75) Inventors: Rahim Bagheri, Los Angeles, CA (US); Masoud Djafari, Marina Del Rey, CA (US)

(73) Assignee: WiLinx, Inc., Los Angeles, CA (US)

( * ) Notice: Subject to any disclaimer, the term of this patent is extended or adjusted under 35 U.S.C. 154(b) by 255 days.

(21) Appl. No.: 11/106,902

(22) Filed: Apr. 14, 2005

(65) Prior Publication Data

US 2006/0234665 A1 Oct. 19, 2006

(51) Int. Cl.
*H03B 21/00* (2006.01)
*H04B 1/18* (2006.01)
*G06G 7/16* (2006.01)

(52) U.S. Cl. ............... 331/40; 327/359; 455/323
(58) Field of Classification Search ........... 331/40, 331/37; 455/323, 118, 293; 327/359
See application file for complete search history.

(56) References Cited

U.S. PATENT DOCUMENTS

| 7,092,692 B2 * | 8/2006 | Tan et al. ............ 455/333 |
| 2002/0047735 A1 | 4/2002 | Grasset et al. |
| 2003/0216131 A1 | 11/2003 | Kovacevic et al. |
| 2006/0055461 A1 | 3/2006 | Lee et al. |

* cited by examiner

*Primary Examiner*—Joseph Chang
(74) *Attorney, Agent, or Firm*—Fountainhead Law Group, P.C.; Chad R. Walsh

(57) ABSTRACT

Embodiments of the present invention include mixer circuits and methods with improved spectral purity. In one embodiment the present invention includes a mixer circuit comprising a first transistor having a gate, a source and a drain, a second transistor having a gate, a source and a drain, a first capacitance coupled between the source of the first transistor and the source of the second transistor and a bias circuit having an input, a first output coupled to the source of the first transistor and a second output coupled to the source of the second transistor. The present invention may be advantageously used in a wireless transmitter application.

12 Claims, 8 Drawing Sheets

600

700

MIXER CIRCUITS AND METHODS WITH IMPROVED SPECTRAL PURITY

BACKGROUND

The present invention relates to mixer circuits, and in particular, to mixer circuits and methods with improved spectral purity.

Mixer circuits are used in a variety of applications including modulation and demodulation, for example. FIG. 1 is a prior art mixer circuit. Mixer circuit 100 is sometimes referred to as a double balanced mixer because it includes two mixer circuits with outputs coupled together to common resistors. Mixer circuit 100 includes two sets of differential transistors 101-102 and 104-105 that each receive a first differential input signal ("in1+" and "in1−"). The differential transistors 101-102 ("M1" and "M2") receive a bias current from transistor 103 that has a drain connected to the sources of both transistors 101 and 102 and a source connected to a current source 109. Similarly, differential transistors 104-105 ("M4" and "M5") receive a bias current from transistor 106 that has a drain connected to the sources of both transistors 104 and 105 and a source connected to current source 109. Bias transistors 103 and 106 may also perform a voltage-to-current function. A second input voltage signal in2+ may be received at the gate of transistor 103, and a complementary input voltage signal in2− may be received at the gate of transistor 106. These signals (i.e., in2+ and in2−) will be converted to currents and coupled to the differential transistors.

One problem with existing mixer circuits, such as mixer circuit 100, is that device imperfections may result in spectral contamination. Ideally, it is desirable to match M1, M2, M4 and M5. Likewise, it is desirable to match M3 and M6. However, manufacturing variations may cause components of the circuit to be mismatched. Such mismatches may cause the output of the circuit may include a variety of unwanted frequencies. For example, mismatch in devices M3 and M6 may cause odd harmonic distortion and mismatches in the differential devices M1 and M2 or M4 and M5 may cause even harmonic distortion.

FIGS. 2-3 illustrate odd harmonics that are generated from mismatch in the circuit of FIG. 1. Waveform 201 is an example input signal, in1+. When in1+ is high and in1− is low, the current in transistor 103 ("M3"), $I_{o1}$, is flowing through M1 and resistor 107 and the current in transistor 106 ("M6"), $I_{o2}$, is flowing through M5 and resistor 108. When in1+ goes low and in1− goes high, the currents "commutate" (i.e., reverse) and the current in M3, $I_{o1}$, flows through M2 and resistor 108 and the current in M6, $I_{o2}$, is flows through M4 and resistor 107. Ideally, the currents in M3 and M6 are precisely the same. If $I_{o1}$ and $I_{o2}$ are identical, then the differential output voltage will be zero at all times as in1+ and in1− reverse polarity. However, if devices M3 and M6 are mismatched, the currents $I_{o1}$ and $I_{o2}$ will be different. Waveform 202 illustrates the change in the differential output voltage resulting from mismatched currents $I_{o1}$ and $I_{o2}$. When in1+ is high and in1− is low, the differential output voltage is given by the following equation:

$$Vo\_diff = out1 - out2,$$

$$out1 = Vdd - I_{o1}R,$$

$$out2 = Vdd - I_{o2}R,$$

$$Vo\_diff = (I_{o2} - I_{o1})R,$$

When in1+ goes low and in1− goes high, currents $I_{o1}$ and $I_{o2}$ commutate and the differential output voltage is given as follows:

$$Vo\_diff = out1 - out2,$$

$$out1 = Vdd - I_{o2}R,$$

$$out2 = Vdd - I_{o1}R,$$

$$Vo\_diff = -(I_{o2} - I_{o1})R,$$

If $I_{o1}$ and $I_{o2}$ are the same, the differential output will be zero. But if $I_{o1}$ and $I_{o2}$ are mismatched, Vo_diff will transition with the input signals in1+ and in1− as shown in waveform 202. Waveforms 204-206 illustrate the undesired spectral components that will appear at the output of the circuit as result of mismatch in $I_{o1}$ and $I_{o2}$. For example, waveform 204 illustrates a spectral component in Vo_diff having a frequency equal to the transition frequency of the input signals in1+ and in1−. Waveform 205 illustrates a second order harmonic of the fundamental frequency, which will be zero because a full cycle of waveform 205 will occur during a single half-cycle of the input. Waveform 206 illustrates a third order harmonic. FIG. 3 shows the odd harmonic components resulting from current mismatch in mixer 100. As shown in FIG. 3, mismatches in devices M3 and M6 will produce different current $I_{o1}$ and $I_{o2}$ that result in odd harmonic components at the output of the mixer. Such spectral impurities may adversely affect the operation of the system in which the mixer is used.

FIG. 4 illustrates even harmonics that are generated using the circuit of FIG. 1. Mismatches in differential transistors 101 and 102 and/or 104 and 105 may further contribute to the spectral impurity at the output. Waveform 401 shows in1+ and in1− as sinusoids. If transistors 101 and 102 are matched, the currents generated by these transistors in response to inputs in1+ and in1− will be the same. However, if these devices are mismatched, then the currents will be different. If one transistor (e.g., M1) has a larger transconductance than the other transistor (e.g., M2) because of mismatch, then the difference can be modeled as an offset voltage ("Voff") at the gate of M1. Waveform 402 shows in1+ offset by an offset voltage Voff. Waveform 402 is illustrative in understanding the effects of mismatch on the output of the circuit. Waveform 402 illustrates that the crossover points (i.e., switching points) of in1+ and in1− are no longer coincident. When the crossover point of one pair of transistors (e.g., M1 and M2) shifts, then there will be periods of time when two transistors are turned on at the same time (e.g., M1 and M4) and are conducting current to one of the outputs. Likewise, for a short amount of time two transistors will be turned off at the same time (e.g., M2 and M5) and provide no current to the other output. This phenomena is illustrated in waveform 403, which shows the current in M1 generated by in1+. Comparing waveforms 402 and 403 it can be seen that the amount of time M1 is conducting current to the output is increased by an amount of time δt as a result of mismatch. Consequently, M1 may still be conducting current through resistor 107 when M4 turns on and conducts current through resistor 107. Thus, rather than an ideal situation, where $I_{o1}$ and $I_{o2}$ are alternately coupled to resistor 107 as shown in diagram 404, there is a short period of time, δt, where both currents are coupled to the output at the same time as shown in diagram 405. Plot 406 illustrates the current through resistor 107 ("$I_{R107}$") and resistor 108 ("$I_{R108}$") as a function of time. As shown in 406, mismatches in the differential devices may cause both transistors M1 and M4 to conduct current into resistor 107 for a short period of time, δt, resulting in a series of current pulses that occur twice per period of in1+ and in1−. Similarly, such mismatches may cause both transistors M2 and M5 to be turned off (i.e., zero current) for a short period of time, δt, resulting in a series of negative current pulses that occur twice per period of in1+ and in1−. The effect of these current pulses is shown in plot 407. If the currents $I_{o1}$ and $I_{o2}$ are equal, then the current pulses will generate differential output voltage ("Vo_diff") pulses equal to $2I_oR$ having a period of $T_o$. Since the current pulses occur twice for every period of in1+ and in1− (i.e., $T_o$ is one-half the period of the input signal), the fundamental frequency of the output pulses will be twice the frequency of the input, and the output will include additional harmonics at even multiples of the input signal frequency.

In some cases, harmonic impurities resulting from manufacturing variances may be very small and effectively negligible. However, variations in the manufacturing process may cause different devices to exhibit different levels of harmonics. When the variances are sufficiently large, harmonic impurity may impact system performance, and in some cases may even cause the system to be completely inoperable. Thus, some portion of the circuits produced by the manufacturing process may have to be discarded, thereby affecting the "yield" of the process. Reducing the harmonic impurity caused by manufacturing variations would improve the production yield.

It is generally desirable to reduce the amount of harmonic impurity at the output of a mixer. Moreover, it is generally desirable to improve the yield of a manufacturing process. Thus, there is a need for improved mixer circuits and methods for improving the spectral purity of mixer circuits.

SUMMARY

Embodiments of the present invention include circuits and methods for improving the spectral purity of mixer circuits. In one embodiment the present invention includes a mixer circuit comprising a first transistor having a gate, a source and a drain, a second transistor having a gate, a source and a drain, a first capacitance coupled between the source of the first transistor and the source of the second transistor and a bias circuit having an input, a first output coupled to the source of the first transistor and a second output coupled to the source of the second transistor.

In another embodiment, the present invention includes a mixer circuit comprising a first transistor having a gate, a source and a drain, a second transistor having a gate, a source and a drain, a third transistor having a gate, a source and a drain, a fourth transistor having a gate, a source and a drain, a first capacitance coupled between the source of the first transistor and the source of the second transistor, a second capacitance coupled between the source of the third transistor and the source of the fourth transistor and a bias circuit having first and second inputs, a first output coupled to the source of the first transistor, a second output coupled to the source of the second transistor, a third output coupled to the source of the third transistor and a fourth output coupled to the source of the fourth transistor.

A mixer circuit comprising a first transistor having a gate, a source and a drain, a second transistor having a gate, a source and a drain, a first capacitor coupled between the source of the first transistor and the source of the second transistor, a first resistor having a first terminal coupled to the source of the first transistor and a second terminal coupled to a first reference voltage, a second resistor having a first terminal coupled to the source of the second transistor and a second terminal coupled to the first reference voltage, a second capacitor having a first terminal coupled to the source of the first transistor and a third capacitor having a first terminal coupled to the source of the second transistor.

The following detailed description and accompanying drawings provide a better understanding of the nature and advantages of the present invention.

DETAILED DESCRIPTION

Described herein are circuits and methods for reducing spectral impurity in mixer circuits. In the following description, for purposes of explanation, numerous examples and specific details are set forth in order to provide a thorough understanding of the present invention. However, it will be evident to one skilled in the art that embodiments of the present invention may include other equivalent embodiments or basic modifications of the examples shown below. For example, while the embodiments and examples below are presented using NMOS transistors, other transistors such as PMOS or bipolar may be used. Thus, the invention, as defined by the claims, may include some or all of the features in these examples alone or in combination with other features described below along with equivalents.

Figure 5:
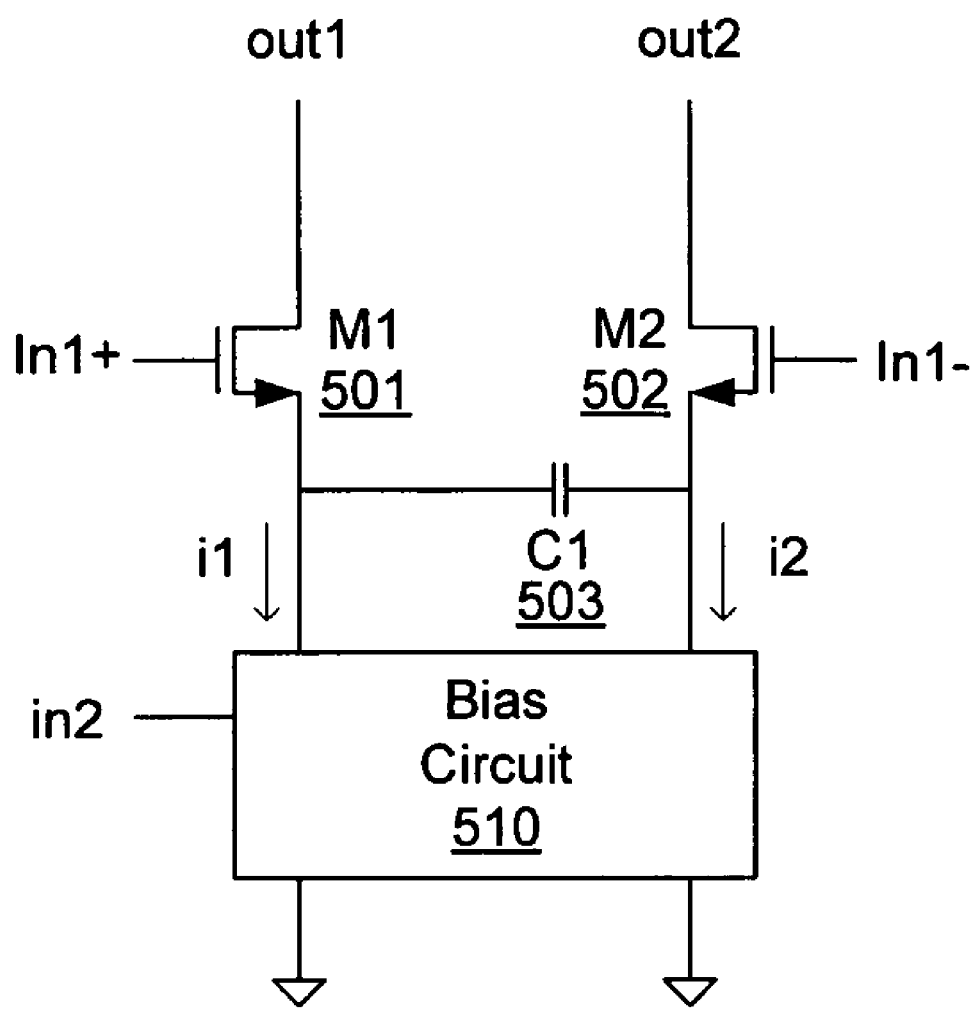
FIG. 5 illustrates a mixer circuit according to one embodiment of the present invention.

FIG. 5 illustrates a mixer circuit 500 according to one embodiment of the present invention. Mixer circuit 500 includes a first transistor 501 ("M1") having a gate, a source and a drain and a second transistor 502 ("M2") having a gate, a source and a drain. M1 and M2 may be matched devices, but may not be perfectly matched because of manufacturing variations, for example. Rather than a typical differential pair, where the sources are connected together, a capacitance, such as a capacitor 503 ("C1"), is coupled between the source of M1 and the source of M2. Mixer circuit 500 also includes a bias circuit 510, which may be any one of a variety of architectures. Bias circuit 510 has a first output coupled to the source of M1 and a second output coupled to the source M2. The term bias circuit, as used herein, means a circuit that provides DC bias currents to the switching transistors M1 and M2 and couples an AC signal to the sources (or emitters, in a bipolar implementation) of these devices. Bias circuit 510 provides bias currents i1 and i2 to the sources of M1 and M2. Bias circuit 510 also includes an input for receiving an input signal, "in2." The input signal is coupled to the sources of M1 and M2. For example, if the input signal is an AC current signal, bias circuit 510 may couple the input to currents i1 and i2. Currents i1 and i2 may thereby have both AC and DC components. If the input signal is a voltage signal, bias circuit 510 may include voltage-to-current conversion functionality so that the input signal is translated into an AC component on the current signals i1 and i2. A variety of voltage-to-current converters may be used for this function. An output of a voltage-to-current converter may be coupled to the sources of M1 and M2 through internal capacitors, for example.

Figure 4:
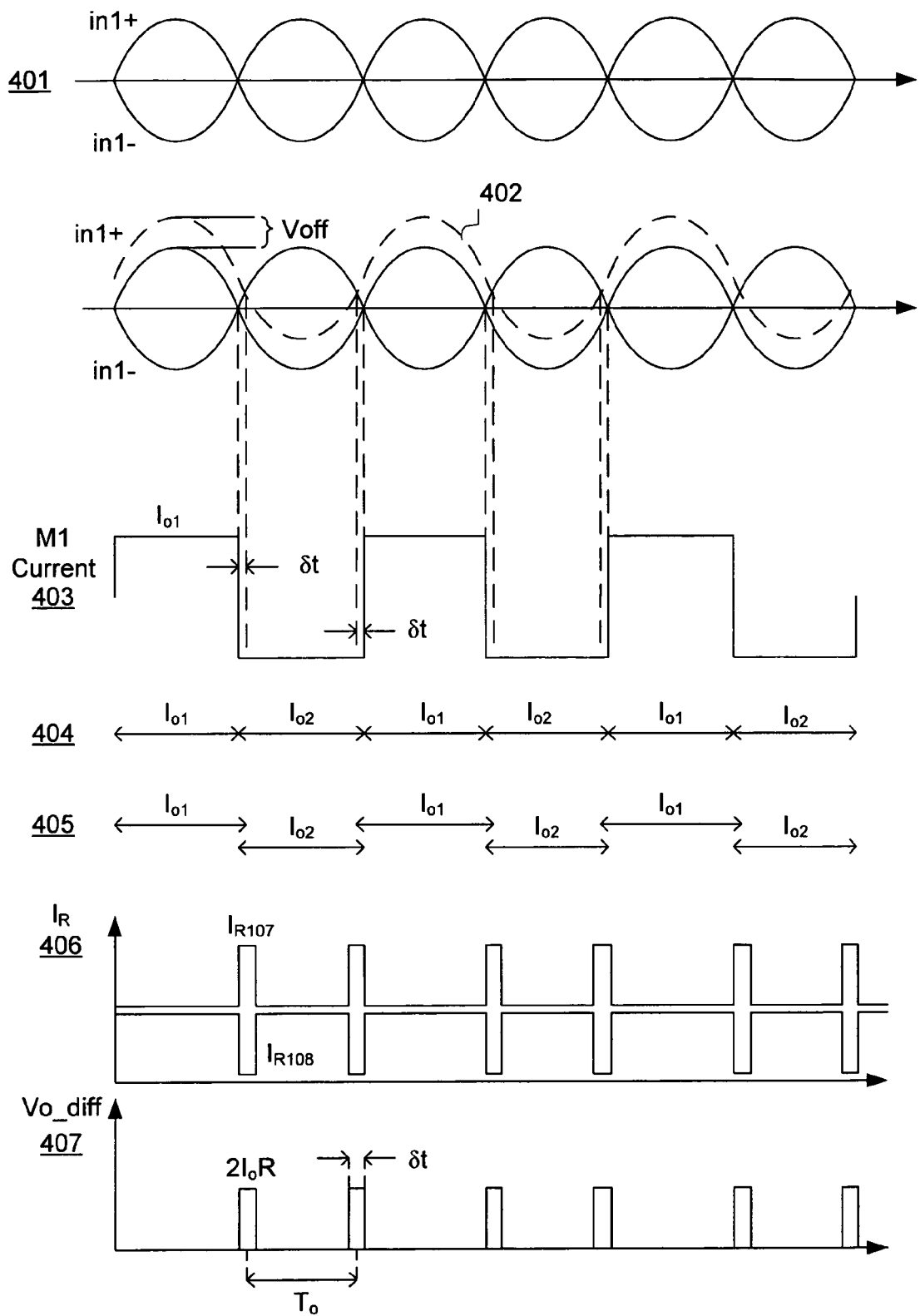
FIG. 4 illustrates even harmonics that are generated using the circuit of FIG. 1.

Advantageously, C1 reduces the harmonic impurity caused by mismatch between M1 and M2. Because the sources of M1 and M2 are not connected together, each device may operate at a different source voltage. Thus, if the devices are mismatched, a voltage will be stored on C1 that will compensate for the mismatch and the crossover points will shift closer to a 50% duty cycle. Accordingly, the even harmonics illustrated in FIG. 4 may be reduced or effectively eliminated and the output spectral purity is improved.

Figure 6:
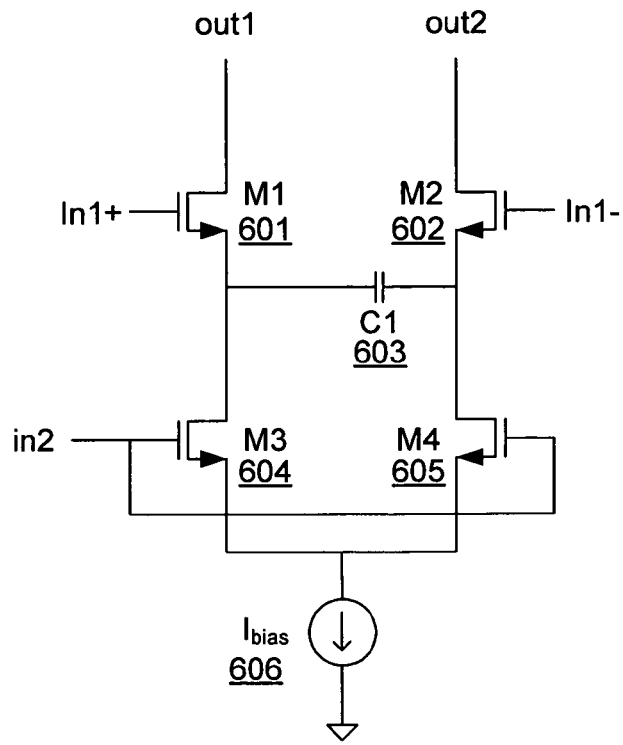
FIG. 6 is an example of a mixer circuit using transistor biasing according to one embodiment of the present invention.

FIG. 6 is an example of a mixer circuit 600 using transistor biasing according to one embodiment of the present invention. Mixer circuit 600 includes a first transistor 601 ("M1") having a source coupled through capacitor 603 ("C1") to the source of a second transistor 602 ("M2"). The bias circuit in this example includes transistor 604 ("M3"), transistor 605 ("M4") and a bias current source 606 ("Ibias"). The sources of M3 and M4 receive a bias current from source 606. The drain of M3 is coupled to the source of M1 and the drain of M4 is coupled to the source of M2. Thus, the bias currents in M3 and M4 are provided to the sources of M1 and M2. It is to be understood that the bias current in M3 and M4 may be implemented using any of a variety of techniques including gate biasing, for example. Additionally, a second input signal, "in2," may be coupled to the gate of both transistors M3 and M4. If "in2" is a voltage signal, M3 and M4 provide voltage-to-current conversion functionality and will convert the voltage input signal into a current signal (e.g., as an AC component of the bias current). M3 and M4 may be matched devices, but may not be perfectly matched because of manufacturing variations. Thus, if M3 and M4 were perfectly matched, M1 and M2 may receive substantially the same currents from M3 and M4. Such currents are coupled to the sources of M1 and M2 and combined with differential input signal "in1+" and "in1−." The resulting current signal is provided to outputs "out1" and "out2." In the example of FIG. 6, even order harmonics are reduced by including capacitor C1. Mismatch in M3 and M4 may also cause even order harmonic impurity because mismatched bias currents in M3 and M4 will change the crossover point in M1 and M2. However, such even order harmonic effects may be reduced by increasing the size of M3 and M4 to reduce current mismatches caused by manufacturing variations. This technique may be effective because in many applications the frequency of "in2" is lower than the frequency of "+/−in1." Therefore, the sizes of M3 and M4 can be increased without impacting system performance.

Figure 7:
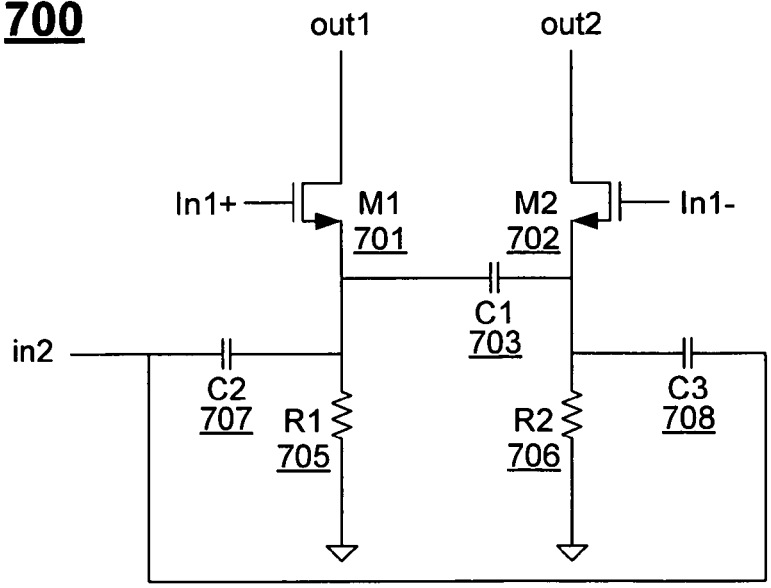
FIG. 7 is an example of a mixer circuit using resistor biasing according to one embodiment of the present invention.

FIG. 7 is an example of a mixer circuit 700 using resistor biasing according to one embodiment of the present invention. Mixer circuit 700 includes a first transistor 701 ("M1") having a source coupled through capacitor 703 ("C1") to the source of a second transistor 702 ("M2"). The bias circuit in this example includes resistor 705 ("R1") and resistor 706 ("R2"). R1 has a first terminal coupled to the source of M1 and a second terminal coupled to a reference voltage (e.g., ground). Similarly, R2 has a first terminal coupled to the source of M2 and a second terminal coupled to the reference voltage (e.g., ground). Thus, R1 and R2 are used to set the bias current in M1 and M2. Additionally, a second input signal, "in2," may be coupled to the sources of M1 and M2. For example, "in2" may be received on the first terminal of capacitor 707 ("C2") and capacitor 708 ("C3"). The second terminal of capacitor 707 may be coupled to the source of M1, and the second terminal of capacitor 708 may be coupled to the source of M2. Thus, if "in2" is a current signal, it will be AC coupled to the sources of M1 and M2 where it will be combined with differential input signal "in1+" and "in1−." The resulting current signal is provided to outputs "out1" and "out2." Since the absolute value of resistors can be matched accurately on an integrated circuit process, resistor biasing, together with capacitor C1, reduces both even and odd harmonic impurity.

Resistor biasing in mixer circuit 700 also reduces harmonics generated by the input signal +/−in1. Ideally, "+/−in1" should be a sinusoid. However, in many applications (e.g., the local oscillator in a wireless application) "in1" is typically a square wave. If the input to M1 and M2 is a square wave, the output spectrum may include the frequency spectrum of the other mixer input, in2, to appear at the output at odd intervals of the fundamental frequency of "in1." Generally, it is desirable to smooth out the input square wave to suppress these odd harmonics. This may be accomplished by reducing the amplitude of the "in1." However, one advantage of resistor biasing is that when "in1" increases in amplitude, the odd harmonic content does not substantially increase. The reason for this is that as the amplitude of "in1" increases, the average DC voltage at the sources of M1 and M2 also increases. The increase in DC voltage at the sources, in turn, increases the bias current through M1 and M2. Increasing the bias current in these devices also increases the point at which the devices will switch in response to differential input signal +/−in 1. Because the switching point is increased, the time it takes for "+/−in1" to switch M1 and M2 is increased to approximately the same amount of time as if the signal had been at a lower amplitude. Thus, the present invention is less susceptible to spectral impurities stemming from larger differential signals.

Figure 8:
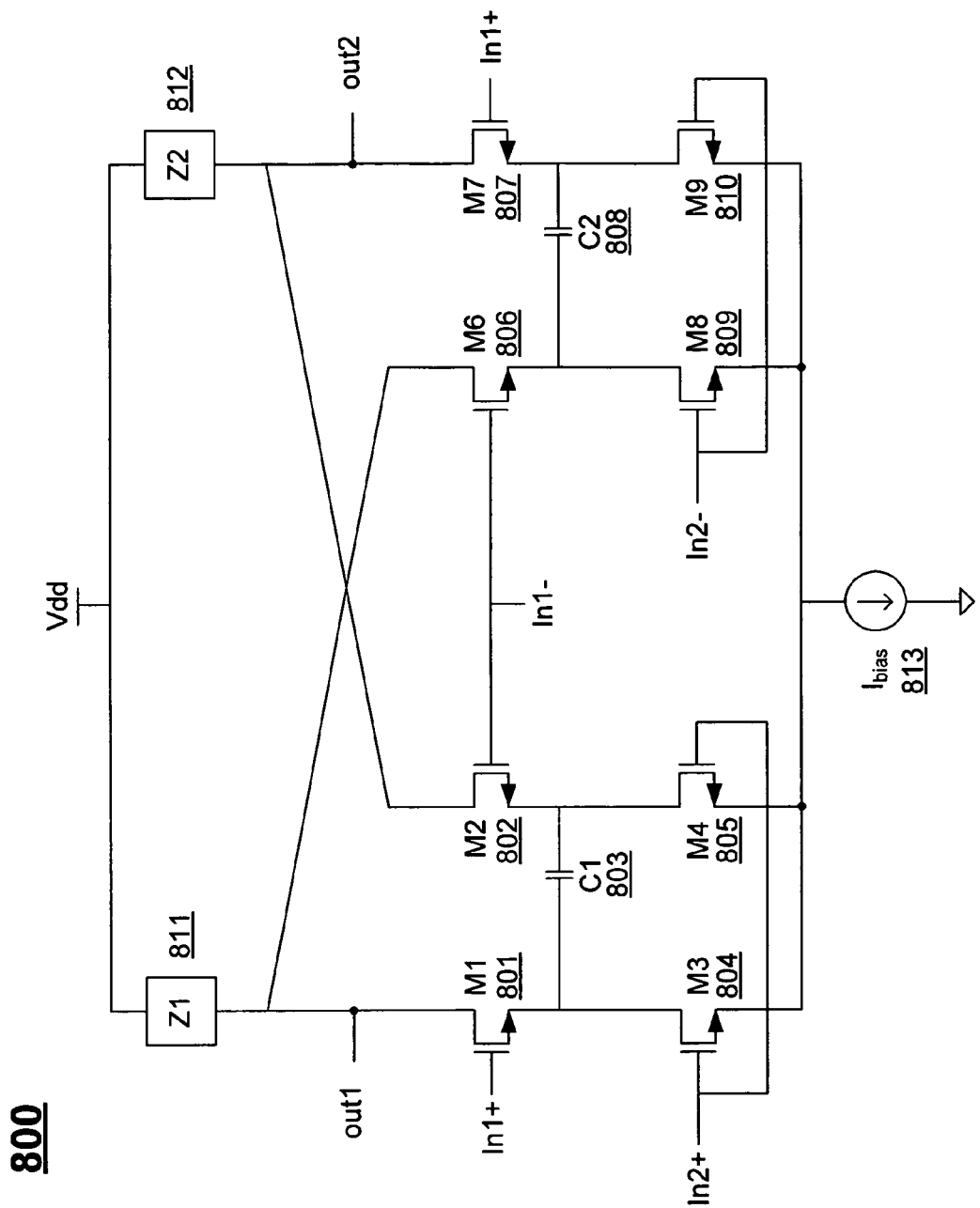
FIG. 8 is an example of a mixer circuit according to another embodiment of the present invention.

FIG. 8 is an example of a mixer circuit 800 according to another embodiment of the present invention. Mixer circuit 800 is sometimes referred to as a "double balanced" mixer because it includes two mixer stages. Mixer circuit 800 includes a first mixer comprising transistors 801 ("M1"), transistor 802 ("M2"), bias transistor 804 ("M3"), bias transistor 805 ("M4") and capacitor 803 ("C1"). The gate of M1 receives a first input signal, "in1+," and the gate of M2 receives the complement of the first input signal, "in1−." A first terminal of capacitor C1 is coupled to the source of M1 and a second terminal of C1 is coupled to the source of M2. M1 and M2 are biased by M3 and M4 and bias current source 813. A second input signal, "in2," is received at the gates of M3 and M4, converted into a current and coupled to the sources of M1 and M2. Mixer circuit 800 further includes a second mixer comprising transistors 806 ("M6"), transistor 807 ("M7"), bias transistor 809 ("M8"), bias transistor 810 ("M9") and capacitor 808 ("C2"). The gate of M7 also receives the first input signal, "in1+," and the gate of M6 receives the complement of the first input signal, "in1−." A first terminal of capacitor C2 is coupled to the source of M6 and a second terminal of C1 is coupled to the source of M7. M6 and M7 are biased by M8 and M9 and bias current source 813. A second input signal, "in2," is received at the gates of M8 and M9, converted into a current and coupled to the sources of M6 and M7.

The drains of M1 and M6 are coupled to a first load impedance 811 ("Z1") and the drains of M2 and M6 are coupled to a second load impedance 812 ("Z2"). Load impedances 811 and 812 may be active, complex or real impedances and may include capacitors, inductors or resistors for implementing narrowband, wideband or tuned filters, for example. In one embodiment, load impedance Z1 is a resistor having a first terminal coupled to the drain of M1 and M6 and a second terminal coupled to a reference voltage such as a power supply, "Vdd." Additionally, load impedance Z2 may also be a resistor having a first terminal coupled to the drain of M2 and M7 and a second terminal coupled to a reference voltage such as a power supply, "Vdd." For a symmetric implementation, devices M1, M2, M6 and M7 are the same size, M3, M4, M8 and M9 are the same size and the load impedances are the same (e.g., resistors with the same resistance value).

In another embodiment, in2 may be a single-ended signal, rather than a fully differential signal, and coupled to only one-half of the double balanced mixer. For example, in2 may only be received at the inputs of either M3 and M4 or M8 and M9. In this approach the double balanced mixer circuit would have one-half the gain.

Figure 9:
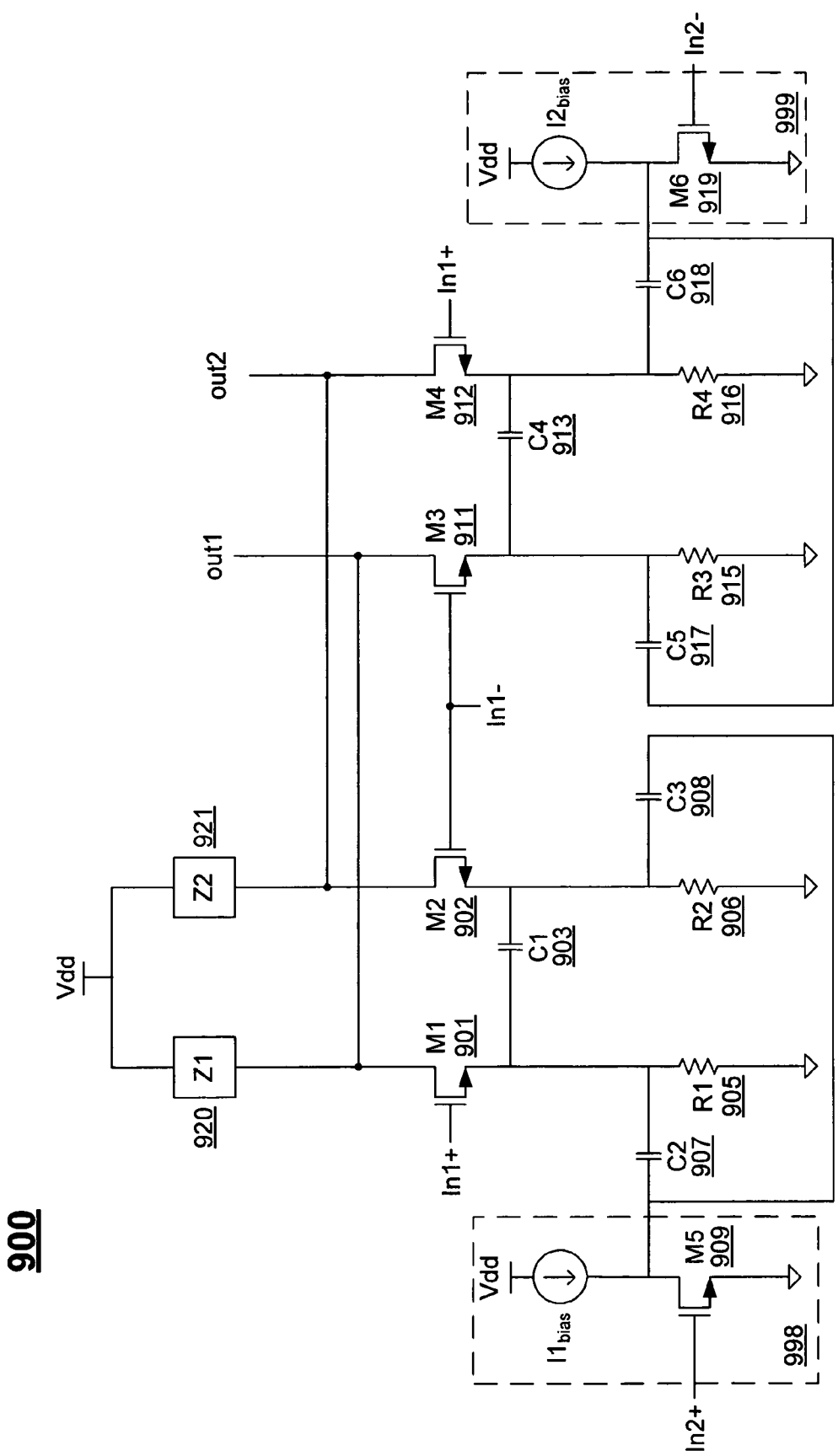
FIG. 9 is an example of a mixer circuit according to yet another embodiment of the present invention.

FIG. 9 is an example of a mixer circuit 900 according to yet another embodiment of the present invention. Mixer circuit 900 is another example of a double balanced mixer. Example mixer circuit 900 is the same as example mixer circuit 800 except for the bias circuit. The bias circuit in mixer 900 includes, in the first mixer stage, resistor 905 ("R1"), resistor 906 ("R2"), capacitor 907 ("C2"), capacitor 908 ("C3"), transistor 909 ("M5") and bias current "I1bias" for biasing M5. In the second mixer stage, the bias circuit includes resistor 915 ("R3"), resistor 916 ("R4"), capacitor 917 ("C5"), capacitor 918 ("C6"), transistor 919 ("M6") and bias current "I2bias" for biasing M6.

In the first mixer stage, a first terminal of R1 is coupled to the source of M1 and the second terminal of R1 is coupled to a reference voltage (e.g., ground). Similarly, a first terminal of R2 is coupled to the source of M2 and the second terminal of R2 is coupled to the reference voltage (e.g., ground). R1 and R2 set the bias current for M1 and M2 in the first stage of the mixer. Likewise, R3 and R4 set the bias current for M3 and M4 in the second stage of the mixer. A first terminal of R3 is coupled to the source of M3 and the second terminal of R3 is coupled to a reference voltage (e.g., ground). Similarly, a first terminal of R4 is coupled to the source of M4 and the second terminal of R4 is coupled to the reference voltage (e.g., ground). R1, R2, R3 and R4 may be matched elements on an integrated circuit process to that the currents provided to M1, M2, M3 and M4 are substantially the same.

In mixer circuit 900, transistors M5 and M6 and current sources I1bias and I2bias provide voltage-to-current functionality. However, these are only examples of how voltage-to-current conversion may be implemented. Many other techniques could also be used. The bias circuit for mixer 900 receives a differential voltage input signal "in2+" and "in2−." In2+ is received at the gate of M5 and converted into a current. The drain of M5 is coupled to a first terminal of capacitor C2 and capacitor C3. The other terminal of capacitor C2 is coupled to the source of M1 so that the signal in2+is coupled to M1. Likewise, the other terminal of capacitor C3 is coupled to the source of M2 so that in2+ is also coupled to M2. The complement of in2+ (i.e., in2−) is received at the gate of M6 and coupled through capacitors C5 and C5 to the sources of M3 and M4. The combined signals +/−in1 and +/−in2 are provided on differential outputs "out1" and "out2." The outputs are coupled to supply Vdd through load impedances 920 ("Z1") and 921 ("Z2"). As mentioned above with reference to FIG. 7, resistor biasing provides improved matching and tracking across manufacturing processes. Thus, even order harmonics are reduced by introducing capacitors C1 and C4, and odd order harmonics may be reduced via the improved tracking of R1-R4.

While the above circuit shows in2 as a differential voltage signal, it is to be understood that a variety of other signals may be received at the input of mixer 900. For example, more generally, transistors M5 and M6 and bias currents I1bias and I2bias could be dependent current sources 998 and 999 (or alternatively, part of the same bias system) that receive either a voltage input signal or a current input signal and provide a current output signal. Thus, the circuit may include either a voltage-to-current converter or a current-to-current converter for providing a current signal to the mixer. Additionally, in2 may be a differential voltage signal (as shown) or a differential current signal. In2 may also be a single ended signal, and the dependent current source (i.e., the voltage-to-current or current-to-current converter) may produce a differential output to both halves of the double balanced mixer. In yet another implementation, in2 may be a single-ended signal, rather than a fully differential signal, and may be coupled to only one-half of the double balanced mixer. For example, in2 may only be received at the inputs of C2 and C3, for example, and C5, C6, M5, and I2bias are not included. As in the single ended case mentioned above with reference to FIG. 8, such an implementation would have one-half the gain.

Figure 1:
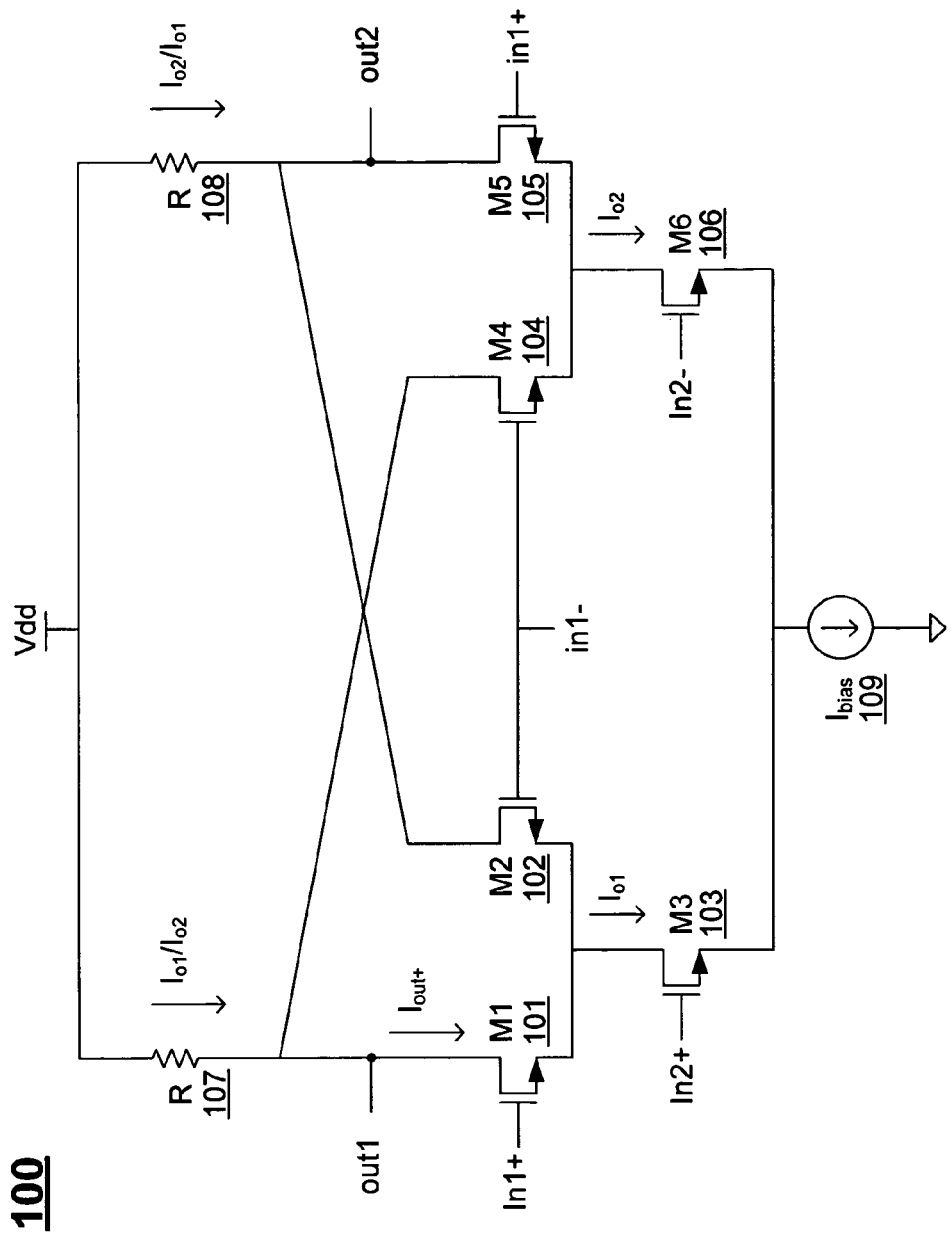
FIG. 1 is a prior art mixer circuit.
Figure 2:
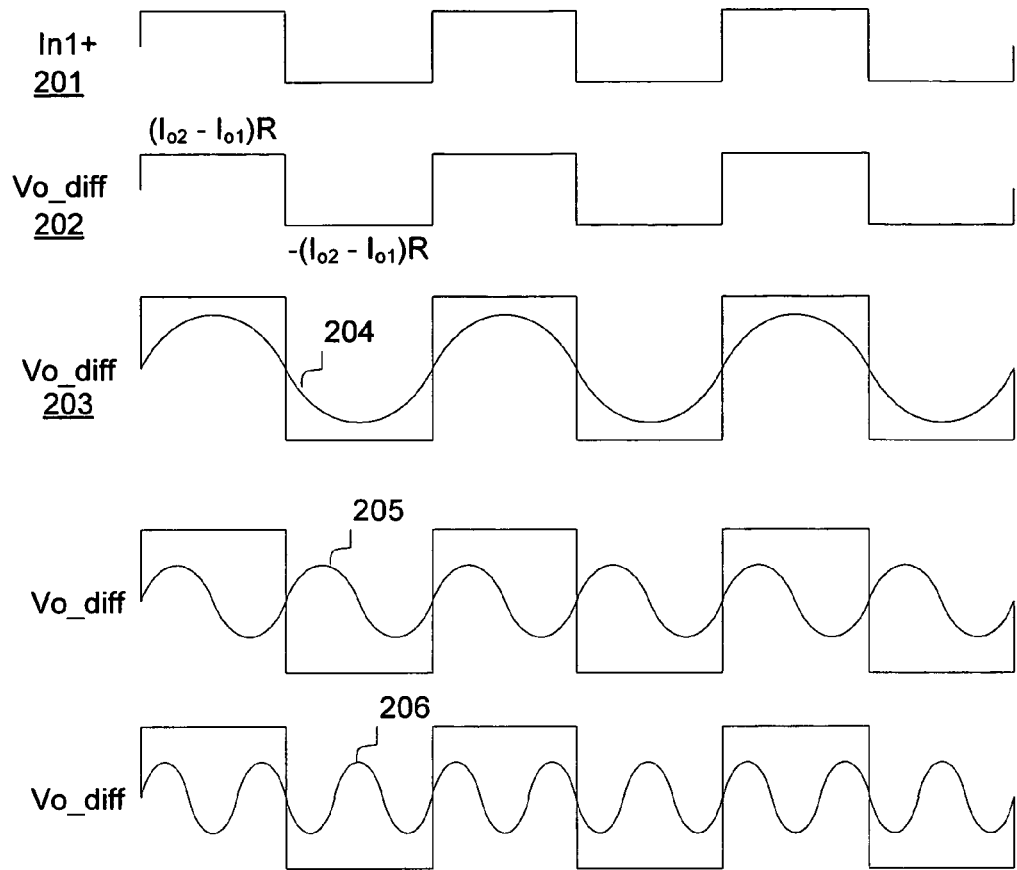
FIGS. 2-3 illustrate odd harmonics that are generated using the circuit of FIG. 1.
Figure 3:
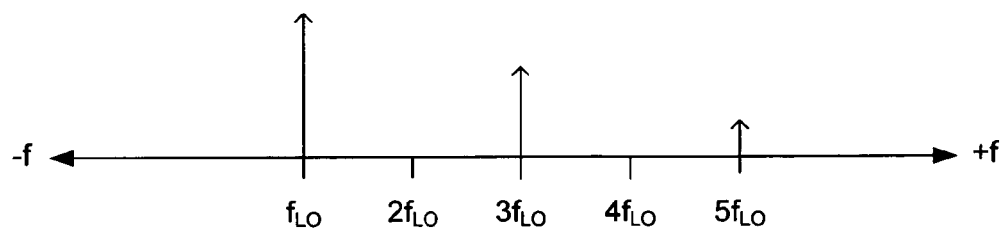
Figure 10:
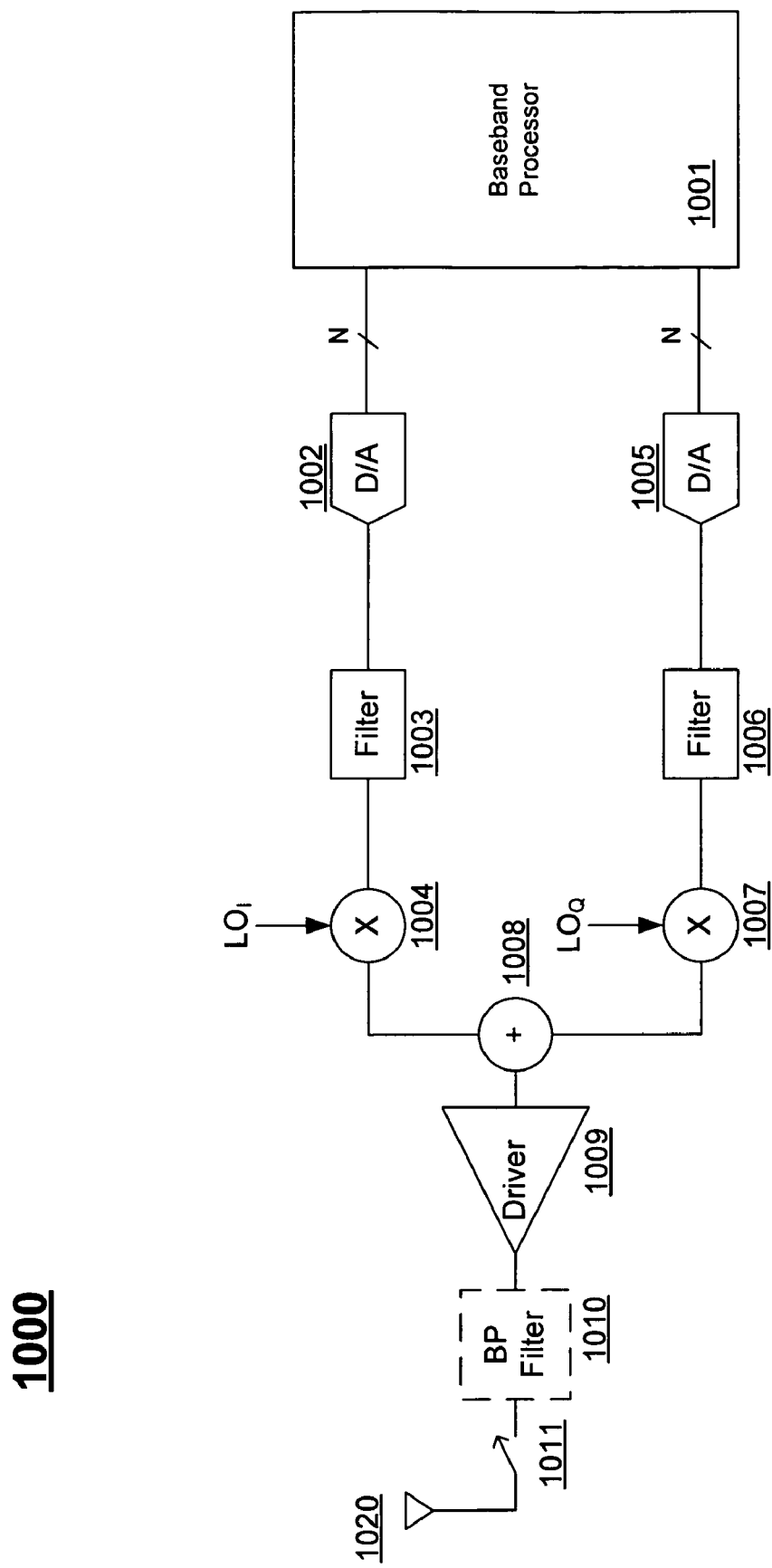
FIG. 10 illustrates one advantageous application of mixer circuits according to embodiments of the present invention.

FIG. 10 illustrates one advantageous application of mixer circuits according to embodiments of the present invention. In one embodiment, mixer circuits according to the present invention may be used to up-convert signals in a wireless transmitter. FIG. 10 shows an example of a wireless transmitter 1000. Wireless transmitter 1000 includes a baseband processor 1001 for providing digital signals to be transmitted. In this example, the transmitter is a direct conversion architecture including a quadrature path and an in-phase path. However, the present invention is also advantageous in other transmitter architectures. The in-phase path may include digital-to-analog converter 1002 ("D/A"), filter 1003 and mixer 1004. The quadrature path may include D/A 1005, filter 1006 and mixer 1007. The digital signals are received in each D/A over N-bit signals lines, for example, converted into analog signals, filtered and up-converted to an RF frequency by modulating the analog signal with in-phase and quadrature local oscillator signals ("$LO_I$" or "$LO_Q$"). The modulated signals are then summed and coupled through driver 1010, which may be a power amplifier, to antenna 1020. Features and advantages of the present invention include eliminating filter requirements in the transmission channel. As shown in FIG. 10, a bandpass filter 1010 ("BP Filter") is typically required to filter out unwanted spectral impurities such as the even and odd order harmonics illustrated in FIGS. 2-4. However, the present invention eliminates the need for a bandpass filter after the mixer because the spectral impurities in the mixer output signal have been reduced or effectively eliminated. Thus, BP Filter 1010 is shown as a dashed box to illustrate that such component is no longer necessary.

The present invention is particularly advantageous for wideband or multi-band transmission applications. For example, in one embodiment, a mixer circuit receives a local oscillator signal having a frequency in the range of 3-10 GHz on a first input and an analog signal having a bandwidth of up to 250 MHz on a second input. A transmitter using embodiments of the present invention may transmit a signal across the 3-10 GHz range because the bandpass filter, which previously would have prevented such wideband transmission, has been eliminated. Previously, harmonic impurity would have affected other systems operating in other bandgroups, and a bandpass or narrowband filter at the output of the system was required to reduce the effects of such harmonics. Using embodiments of the present invention, a static narrow band filter at the output may be eliminated, which allows the system to transmit across a wide range of frequencies such as, for example, from 3-10 GHz. It is to be understood that these techniques may also be used in narrowband applications where harmonic spurs are to be suppressed. In particular, when the harmonics are reduced or eliminated the requirements of a narrowband filter may be advantageously relaxed.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. In particular, while the embodiments and examples above were presented using NMOS transistors, other transistors such as PMOS or bipolar may also be used. Based on the above disclosure and the following claims, other arrangements, embodiments, implementations and equivalents will be evident to those skilled in the art and may be employed without departing from the spirit and scope of the invention as defined by the claims.

What is claimed is:

1. A mixer circuit comprising:
   a first transistor having a gate, a source, and a drain;
   a second transistor having a gate, a source, and a drain;
   a first capacitance coupled between the source of the first transistor and the source of the second transistor; and
   a bias circuit having an input, a first output coupled to the source of the first transistor and a second output coupled to the source of the second transistor, wherein the bias circuit includes a first resistor coupled to the source of the first transistor and a second resistor coupled to the source of the second transistor,
   and wherein the first resistor is coupled between the source of the first transistor and a reference voltage and the second resistor is coupled between the source of the second transistor and the reference voltage.

2. The mixer circuit of claim 1 further comprising a second capacitance coupled to the source of the first transistor and a third capacitance coupled to the source of the second transistor.

3. The mixer circuit of claim 2 further comprising a voltage-to-current converter having an input that receives a voltage input signal and an output coupled to the second and third capacitance.

4. A mixer circuit comprising:
   a first transistor having a gate, a source, and a drain;
   a second transistor having a gate, a source, and a drain;
   a first capacitance coupled between the source of the first transistor and the source of the second transistor; and
   a bias circuit having an input, a first output coupled to the source of the first transistor and a second output coupled to the source of the second transistor, wherein the gates of the first and second transistors are coupled to a local oscillator, the bias circuit input is coupled to a digital-to-analog converter and the drains of the first and second transistors are coupled to a driver circuit for transmitting an RF signal.

5. A mixer circuit comprising:
   a first transistor having a gate, a source, and a drain;
   a second transistor having a gate, a source, and a drain;
   a third transistor having a gate, a source, and a drain;
   a fourth transistor having a gate, a source, and a drain;
   a first capacitance coupled between the source of the first transistor and the source of the second transistor;
   a second capacitance coupled between the source of the third transistor and the source of the fourth transistor; and
   a bias circuit having first and second inputs, a first output coupled to the source of the first transistor, a second output coupled to the source of the second transistor, a third output coupled to the source of the third transistor, and a fourth output coupled to the source of the fourth transistor,
   wherein the bias circuit comprises:
   a first resistor having a first terminal coupled to the source of the first transistor and a second terminal coupled to a reference voltage;
   a second resistor having a first terminal coupled to the source of the second transistor and a second terminal coupled to the reference voltage;
   a third resistor having a first terminal coupled to the source of the third transistor and a second terminal coupled to the reference voltage; and
   a fourth resistor having a first terminal coupled to the source of the fourth transistor and a second terminal coupled to the reference voltage.

6. The mixer circuit of claim 5 wherein the bias circuit comprises:
   a fifth transistor having a gate, a source and a drain, wherein the gate receives a first voltage input signal and generates a first current output signal on the drain, and wherein the first current output signal is coupled to the source of the first transistor and the source of the second transistor; and
   a sixth transistor having a gate, a source and a drain, wherein the gate receives a second voltage input signal that is a complement of the first voltage input signal and generates a second current output signal on the drain, and wherein the second current output signal is coupled to the source of the third transistor and the source of the fourth transistor.

7. The mixer circuit of claim 6 further comprising:
   a third capacitor having a first terminal coupled to the source of the first transistor and a second terminal coupled to the drain of the fifth transistor;
   a fourth capacitor having a first terminal coupled to the source of the second transistor and a second terminal coupled to the drain of the fifth transistor;
   a fifth capacitor having a first terminal coupled to the source of the third transistor and a second terminal coupled to the drain of the sixth transistor; and
   a fourth capacitor having a first terminal coupled to the source of the fourth transistor and a second terminal coupled to the drain of the sixth transistor.

8. A mixer circuit comprising:
   a first transistor having a gate, a source and a drain;
   a second transistor having a gate, a source and a drain;
   a first capacitor coupled between the source of the first transistor and the source of the second transistor;

a first resistor having a first terminal coupled to the source of the first transistor and a second terminal coupled to a first reference voltage;

a second resistor having a first terminal coupled to the source of the second transistor and a second terminal coupled to the first reference voltage;

a second capacitor having a first terminal coupled to the source of the first transistor; and a third capacitor having a first terminal coupled to the source of the second transistor.

9. The mixer circuit of claim 8 further comprising a third transistor having a gate, a source and a drain, wherein the gate receives a voltage input signal and generates a current output signal on the drain, and wherein the current output signal is coupled a second terminal of the second capacitor and a second terminal of the third capacitor.

10. The mixer circuit of claim 8 further comprising:

a third resistor having a first terminal coupled to the drain of the first transistor and a second terminal coupled to a second reference voltage; and a fourth resistor having a first terminal coupled to the drain of the second transistor and a second terminal coupled to the second reference voltage.

11. The mixer circuit of claim 8 wherein the gates of the first and second transistors are coupled to a local oscillator, the first and second resistors are coupled to a digital-to-analog converter and the drains of the first and second transistors are coupled to a driver circuit for transmitting an RF signal.

12. The mixer circuit of claim 8 further comprising:

a third transistor having a gate, a source and a drain;

a fourth transistor having a gate, a source and a drain;

a fourth capacitor coupled between the source of the third transistor and the source of the fourth transistor;

a third resistor having a first terminal coupled to the source of the third transistor and a second terminal coupled to the first reference voltage;

a fourth resistor having a first terminal coupled to the source of the fourth transistor and a second terminal coupled to the first reference voltage;

a fifth capacitor having a first terminal coupled to the source of the third transistor; and a sixth capacitor having a first terminal coupled to the source of the fourth transistor.

\* \* \* \* \*